United States Patent [19]

Tsai

[11] Patent Number: 4,680,539
[45] Date of Patent: Jul. 14, 1987

[54] GENERAL LINEAR SHIFT REGISTER
[75] Inventor: Mon Y. Tsai, River Vale, N.J.
[73] Assignee: International Business Machines Corp., Armonk, N.Y.
[21] Appl. No.: 567,217
[22] Filed: Dec. 30, 1983
[51] Int. Cl.[4] .................. G01R 31/28; G11C 19/00
[52] U.S. Cl. ................................ 324/73 R; 377/72
[58] Field of Search ............ 324/73 R, 73 AT; 377/72, 73; 307/471; 340/347 DD; 371/25, 16, 15

[56] References Cited

U.S. PATENT DOCUMENTS

| | | | |
|---|---|---|---|
| 3,602,732 | 8/1969 | Suzuki | 307/471 X |
| 3,790,885 | 2/1974 | James | 324/73 R |
| 3,815,025 | 6/1974 | Jordan | 324/73 R X |
| 4,225,957 | 9/1980 | Doty, Jr. et al. | 371/15 X |
| 4,233,524 | 11/1980 | Burdick | 307/468 X |
| 4,244,048 | 1/1981 | Tsui | 324/73 R |
| 4,328,435 | 5/1982 | Case | 307/471 |
| 4,513,418 | 4/1985 | Bardell, Jr. et al. | 324/73 R |

OTHER PUBLICATIONS

V. H. Tatak and J. W. McCullough; "Level Sensitive Logic Testing Method"; 1975 IBM Technical Disclosure Bulletin; vol. 17, No. 12; May 1975; pp. 3680-3681.
P. Goel and E. P. Hsieh; "Testing of Random Logic"; 1973 IBM Technical Disclosure Bulletin; vol. 16, No. 2; Jul. 1973; pp. 429-430.
Könemann et al; "Built in Test for Complex Digital Integrated Circuits", IEEE Journal of Solid State Circuits; vol. SC-15, No. 3; Jun. 1980; pp. 315-319.
Joachim Mucha; "Hardware Techniques for Testing VLSI Circuits Based on Built-in Test"; 1981 IEEE; pp. 366-369

Primary Examiner—Ernest F. Karlsen
Assistant Examiner—Vinh Nguyen
Attorney, Agent, or Firm—Pollock, Vande Sande & Priddy

[57] ABSTRACT

A linear feedback shift register for inclusion in a VLSI circuit. During a test function for the VLSI circuit, the shift register can be programmed into an LSSD test mode, or two generate test patterns for the VLSI circuit, and to perform a corresponding signature analysis on hashing functions on the VLSI response to the test pattern. The linear feedback shift register can be programmed on the VLSI chip to perform any of these test functions. During normal VLSI circuit operation, the shift register is transparent to logic signals carried by the VLSI circuit.

6 Claims, 7 Drawing Figures

GENERAL LINEAR SHIFT REGISTER

BACKGROUND OF THE INVENTION

The present invention relates to VLSI circuit testing techniques. Specifically, a linear feedback shift register for inclusion on a VLSI integrated circuit is described which is programmable for carrying out several common test functions.

The complexity of very large scale integrated circuits, VLSI, renders the testing of such circuits very difficult and expensive. To alleviate the difficulty, circuit testability has been designed into the VLSI circuit. In the past, as outlined in a paper reported in the *IEEE Journal of Solid State Circuits,* Vol. SC-15, No. June 3, 1980, entitled "Built-In Test for Complex Digital Integrated Circuits", a built-in register provides for an input signal drive for circuits under test, and a test answer evaluator in the form of another register permits evaluation of the result of applying the input signal drive to the circuit under test.

The built-in registers have been used as a scan generator to apply a test pattern to the device and compare the circuit response to the test patterns with the applied test patterns. The register may be operated in a serial shift register linear (LSR) mode, permitting the desired test pattern to be serially entered into the register and then latched to provide a desired parallel input to a circuit under test. The circuit under test is then rendered operable and the response to the input is parallel loaded in another LSR mode register. The response to the test is then serially read out to determine whether the circuit under test functioned appropriately. These techniques are generically referred to as level sensitive scan design, LSSD.

More sophisticated testing is performed through the use of random pattern generation and corresponding signature analysis operating the LSR as a linear feedback shift register. The random pattern is generated by a linear differential shift register with appropriate feedback to generate a polynomial pseudo-random number. The polynomial is applied to the circuit under test. The response of the circuit under test to the continuously changing random number is "hashed" or compressed by another linear differential shift register operated as a signature analyzer to preserve any detected errors. At the end of the pattern generation sequence, the hashed result is serially read from the signature analyzer to determine whether the circuit under test performed appropriately.

The on-chip testing techniques using SRL registers all produce hardware overhead for the chip. Additionally, the linear feedback shift register requires feedback connections and control lines adding to the device pin out.

SUMMARY OF THE INVENTION

It is an object of the invention to provide a linear feedback shift register useful for onboard testing of VLSI circuits.

It is a more specific object of this invention to provide a linear feedback shift register which is programmable to provide random pattern generators, signature analyzers and to perform as an LSSD latch.

These and other objects of the invention are provided by a linear feedback shift register which is implemented in NMOS and CMOS. The feedback shift register can be operated in a normal bypass mode whereby the device is transparent to VLSI circuit signals during normal operation. Alternatively, in a test function for a VLSI circuit, the register can be used in an LSSD mode whereby individual bits can be shifted serially into or out of the register cells. Additional programming of the register will permit its use as a test pattern generator or signature analyzer.

This invention, defined more particularly by the claims which follow, comprises a multicell register which can be programmed to carry out the above testing functions. Each cell includes a one bit register connected to receive either normal data from the VLSI circuit, or the output signal frm one serially connected exclusive NOR circuits. The exclusive NOR circuits are connected to provide a logical function of the logic level from a previous or later cell such that test pattern generation, signature analysis or LSSD functions may be provided.

The individual cells in a preferred embodiment are programmable on the VLSI chip. When programmed in the pattern generator mode, the exclusive NOR gates and one bit register provide for each cell the function:

$$\text{FEEDBACK} \oplus \text{SHIFT},$$

wherein FEEDBACK comprises a common feedback signal from the last cell for generating a desired polynomial, and SHIFT comprises the output of a previous cell. In a signature analyzer mode, the individual cells of the register may be programmably connected to provide the logical function:

$$\text{FEEDBACK} \oplus \text{SHIFT} \oplus \text{INPUT}$$

where INPUT is an applied logic level from the circuit under test.

DESCRIPTION OF A PREFERRED EMBODIMENT

Figure 1:
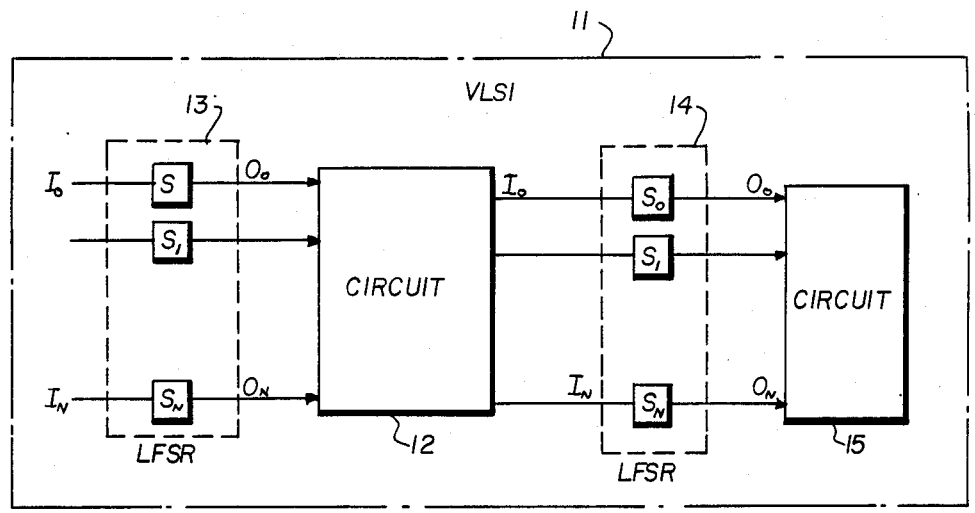
FIG. 1 is a block diagram of a VLSI circuit which includes onboard linear differential feedback shift registers as testing circuits.

Referring to FIG. 1, there is shown a VLSI integrated circuit which includes onboard test capability utilizing a linear feedback shift register according to a preferred embodiment. The VLSI circuit is preferably in NMOS and includes circuits 12 and 15, as well as two linear feedback shift registers, hereinafter LFSR 13 and LFSR 14. Each of the LFSRs includes a plurality of stages, $S_0$ through $S_n$, that register shown in the normal operation wherein input data along the plurality of inputs $I_n$–$I_0$ of the VLSI circuit are transferred through cells $S_0$ through $S_n$ to the circuit 12 under test. Similarly, the LFSR 14 receives outputs from circuit 12 and transfers them in a normal operation directly to circuit 15.

With the VLSI circuit of FIG. 1, it is possible to program each LSFR 13 and LSFR 14 through external pin connections on the VLSI circuit to perform any one of four basic test functions, including the level sensitive scan design (LSSD), as well as the use of test generation polynomials and corresponding hashing of the result. With this latter test technique, as described in the literature previously referenced, the LFSR 13 can be programmed to generate a test pattern which is analyzed in the LFSR 14. Although hardwired external pin connections are utilized in the present example, other techniques such as preprogramming the VLSI mask to effect at least some of the connections is possible. Utilizing the circuit of the preferred embodiment, the LFSR 13 and 14 can be implemented in NMOS technology using only twelve (12) additional devices than is currently employed with a standard LSSD latch. Thus, with a minimum of hardware overhead it is possible to achieve the additional capability of test pattern generation and the hashing of the result.

Figure 2:
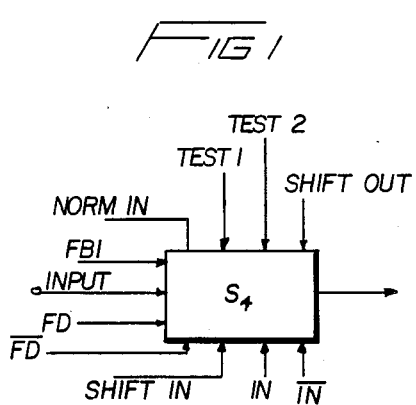
FIG. 2 is a functional block diagram showing a plurality of cells which comprise the linear feedback shift register of FIG. 1.

Referring now to FIG. 2, an LFSR of a preferred embodiment is shown including cells $S_0$–$S_4$. Cell $S_4$ is typical of all cells of the LFSR and for simplicity, the control lines and input-output lines have been shown for a single cell $S_4$ in FIG. 2. Normal INPUT/OUTPUT lines are shown for the cell, as well as the following INPUT/OUTPUT connections:

FBI SHIFT IN SHIFT OUT

Additionally, the following control lines to each cell are provided:

Test 1  Test 2  IN
$\overline{FD}$  FD  $\overline{IN}$

Figure 3:
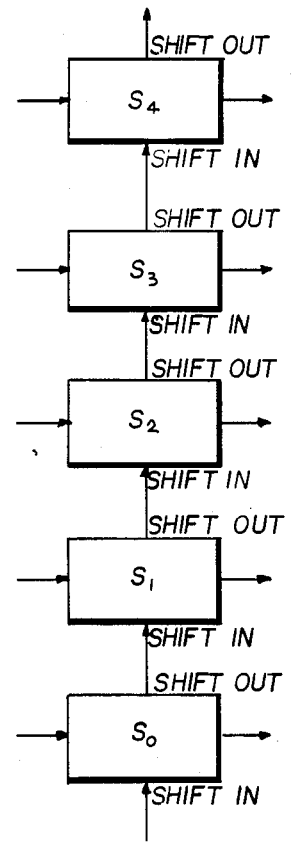
FIG. 3 illustrates the connections of each cell of the linear differential shift register to derive an LSSD register.

Throughout the discussion, it is understood that when FD or IN are at one logic level, the complements $\overline{FD}$ and $\overline{IN}$ are at an opposite logic level. Referring to FIG. 3, the use of the LFSR is shown in FIG. 3 having connections between the SHIFT OUT line of each cell, and a SHIFT IN line of each cell. Additional to the wiring of each cell as shown in FIG. 3, certain clock signals and control signals are applied as follows.

In the LSSD operation, data is fed into the SHIFT IN input of the $S_0$ cell and under the clock sequence of Test 1 and Test 2 which are non-overlapping, inverse clock signals. The data appearing on the SHIFT IN input of cell $S_0$ is propagated under control of the Test 1, Test 2 clock pulses. In normal LSSD operation, sufficient serial data bits are serially shifted into the linear feedback shift register until cells $S_0$ through $S_4$ obtain parallel data for applying to a circuit under test.

Similarly, the LFSR 14 of FIG. 1 is clocked to read out parallel loaded data appearing from the normal input lines from circuit 12. LFSR 14 is serially read out such that the SHIFT OUT pulse of the last cell $S_4$ provides for the serial data which was presented in parallel format to the inputs of register cells $S_0$ through $S_4$.

Figures 4, 5:
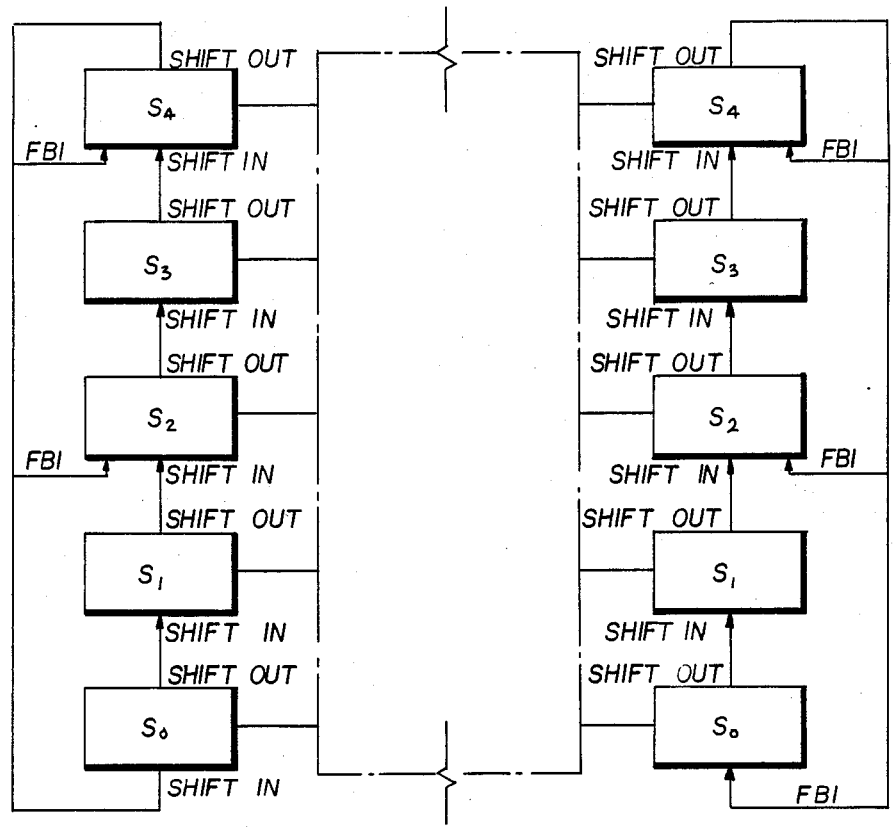
FIG. 4 illustrates the connections of each cell of the linear differential shift register to perform a pattern scan polynomial.
FIG. 5 illustrates the connections of each cell of the linear differential shift register to perform a signature analysis.

Referring now to FIG. 4, a pattern scan generator is shown implementing the LFSR of FIG. 2. The programmed connections between cells $S_0$ and $S_4$ are shown, wherein, as in the LSSD operation, the SHIFT OUT connection of each cell is connected to the SHIFT IN connection of each subsequent cell. Additionally, there is a feedback signal provided to individual selected cells to generate the polynomial of a particular scan pattern. Shown in FIG. 4 are the connections to generate a polynomial having the form $X^5+X^4+X^2+1$. The output lines of the LFSR will generate on a pseudo-random basis a test pattern for applying to the circuit 12 of VLSI circuit 11.

The remaining connections of the LFSR of FIG. 4 are such that the IN connection is 0 and the FD connection is maintained at a logic 1 level. The Test 1 and Test 2 signals are clock signals which are complementary inverse and non-overlapping clock signals.

Referring now to FIG. 5, the hashing function for signature analysis of a circuit under a pattern scan of FIG. 4 is shown. In the circuit of FIG. 5, each of the cells $S_0$ through $S_4$ are programmed through hardwiring pin terminals provided on the VLSI circuit 11 such that, as previous, the SHIFT OUT connection of each cell is applied to a SHIFT IN connection of each subsequent cell. In carrying out the hashing function, however, the first cell $S_0$ has a SHIFT IN connection isolated from the $S_4$ SHIFT OUT connection. Additionally, the FBI connection of each cell is connected to receive a feedback signal from the SHIFT OUT connection of $S_4$.

In carrying out the hashing function, once again clock pulses are applied to the Test 1 and Test 2 connections having an inverse relationship to each other and which are non-overlapping. Additionally, the IN and FD control lines are maintained at logic 1 levels for the hashing function. Input lines of the cells $S_0$ through $S_4$ are connected to receive the output from the circuit 12 under test. The hashing result is clocked from the LFSR by returning to the configuration of FIG. 3, wherein the contents of the entire register may be serially clocked out of the register.

In normal non-test operation of the VLSI circuit, Test 1, Test 2, IN and FD are maintained at zero logic levels, thus rendering the circuit transparent to the normal VLSI circuit operation.

Thus, it is seen with an LFSR having the general configuration of FIG. 2, any one of four modes of operation may be effected, including a normal operation wherein the LFSR is transparent to data on the VLSI circuit, an LSSD function, a pattern generation function, and a hashing function.

Figure 6:
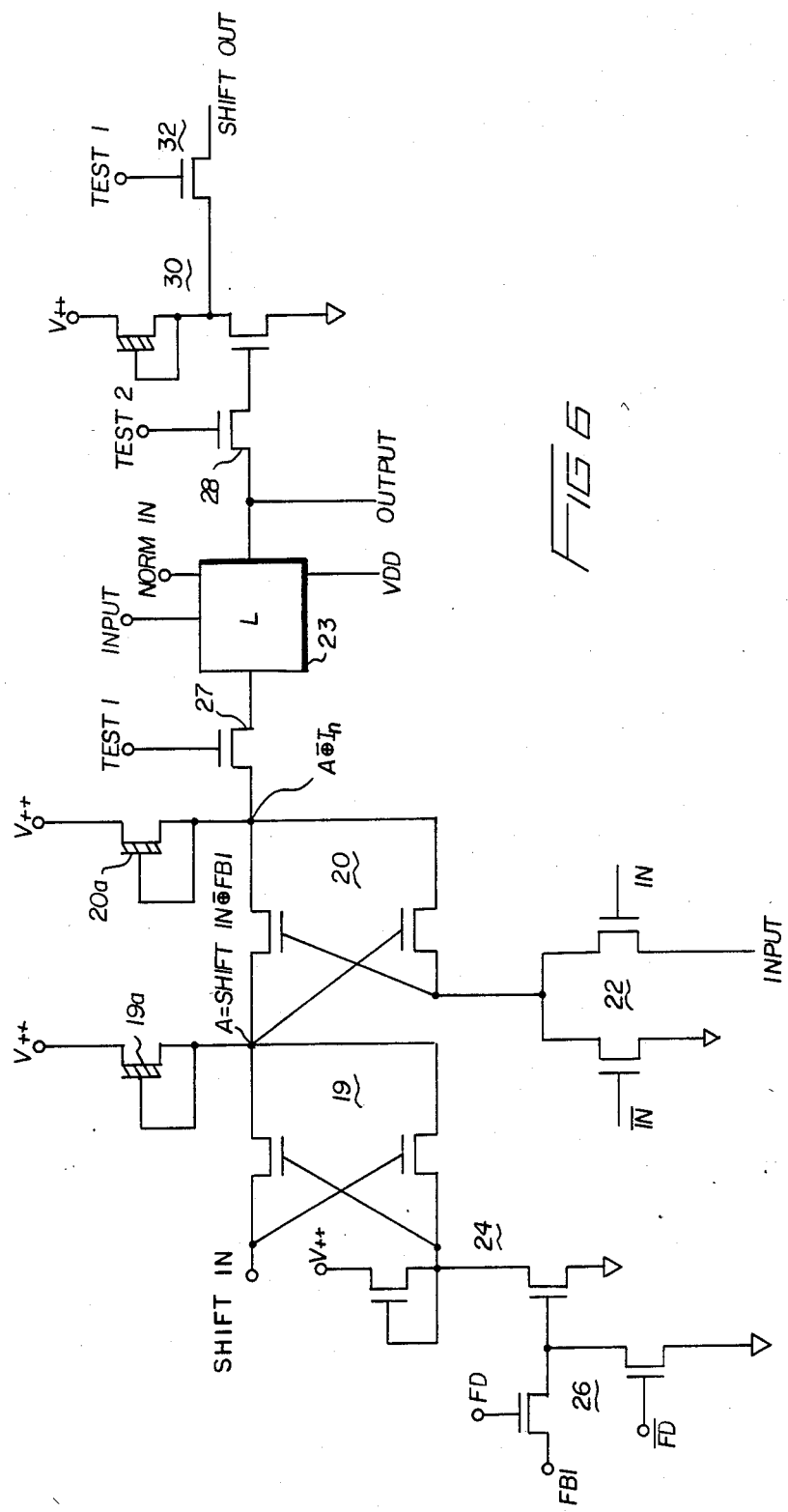
FIG. 6 is a schematic illustration of each cell of the linear differential shift register of FIG. 2.

Referring now to FIG. 6, there is shown one cell $S_4$ of the LFSR of the preferred embodiment. It is to be understood that the remaining cells of the LFSR are identical to that of FIG. 6.

The central portion of each cell comprises a register 23, the register being a one bit register which can accept input from a normal data path for the VLSI circuit, or a test path through gate 27. Gate 27 is an FET which, when appropriately clocked by a Test 1 signal, will provide for a test signal to be applied to the two bit register 23. At the output of the one bit register 23 is a gate 28 which is clocked in accordance with a Test 2 signal. As was explained with respect to the inter-connection of the cells of FIGS. 3 through 5, Test 1 and Test 2 are inverse clock signals which do not overlap. The signal propagated through gate 28 under control of Test 2 clock signal, is inverted by inverter 30. A further gate 32 is used to propagate the results to the SHIFT OUT connection of each cell.

In order to carry out the LSSD shift function, wherein data is serially loaded into one LFSR and serially read out of a second LFSR as described with respect to FIG. 3, the input test pattern is applied serially to the SHIFT IN connection. As the clock pulses are applied to the Test 1 and Test 2 input, the bit pattern will be loaded in all of the cells at the conclusion of the appropriate number of clock pulse cycles.

Two exclusive NOR circuits, 19 and 20, are shown which permit the carrying out of the pattern generation function and the hashing function. The exclusive NOR gates 19 and 20 comprise two cross-coupled FETs, each having a load transistor 19a and 20a connected as load circuits to a voltage source $V_{tt}$. One input of the first exclusive NOR circuit 20 is connected to receive the output of the second exclusive NOR circuit 19 as well as an input signal common to the input of latch 23. A control gate 22 permits connection of the input signal to one input of exclusive NOR gate 20 under control of the IN and $\overline{\text{IN}}$ control lines.

The second exclusive NOR gate, also comprising two cross-coupled FETs with a load impedance comprising a transitor 19a, receives as one input a SHIFT IN signal, and as the other input a FEEDBACK INPUT (FBI) signal. the FBI signal is inverted through inverter 24, and controlled by a gate 26. Gate 26 includes a series FET transistor and parallel FET transistor under control of signals FD and $\overline{\text{FD}}$.

In the pattern generation mode the IN control signal is held to be 0 and the FD signal is held to be 1. Thus, the LFSR will produce a suitable random number having a polynomial defined by the connections of FIG. 4.

During the hashing mode, the IN port is held at 1 and data from the circuit under test enters through the input of gate 22. The FD control signal is held at logic 1, permitting the feedback signal to be propagated to the input of exclusive NOR circuit 19.

Figure 7:
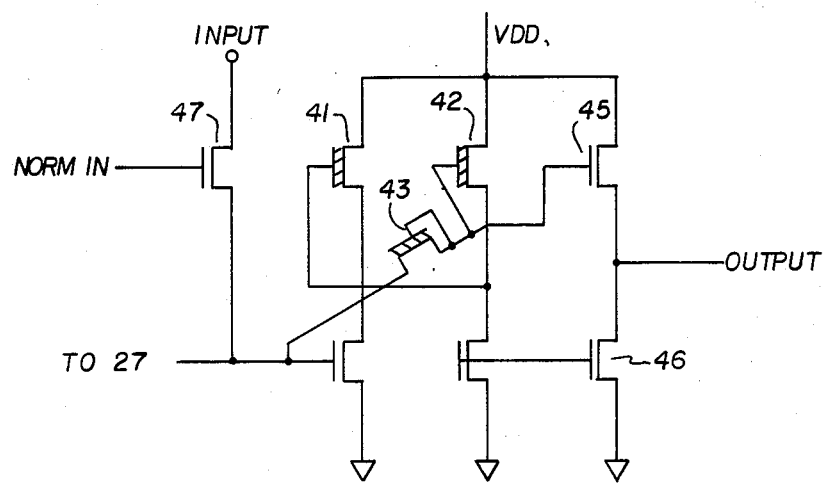
FIG. 7 is a typical one bit register L used in the cell of FIG. 6.

The one bit register 23 is shown more particularly in FIG. 7. It has been found in practice that the register described in the *IBM Technical Disclosure Bulletin*, Vol. 25, No. 7A, December 1982, which shows a cross-coupled register having a transistor in one of the feedback paths between cross-coupled transistor pairs, performs well in the LFSR. FIG. 7 demonstrates the use of the one bit register described in the aforesaid technical disclosure bulletin. The device comprises first and second transistor series pairs 41, 42 cross-coupled to form a latch. One of the cross-coupling lines includes a transitor 43, which as noted in the aforesaid technical disclosure bulletin, improves the speed of the latch device.

Transistors 45 and 46, driven from the nodes of the latch, provide an output which is normally fed to the output gate transistor 28.

Additionally, an input gate 47 is included which, under the control of NORM IN control line, permits the normal input to the register 23 to be received in lieu of a test input through gate 27.

The foregoing description of the individual cells of the LFSR of a preferred embodiment are implemented in NMOS technology, as is the remaining circuitry of the VLSI circuit. Typical voltage connections for the device include the standard 5.0±0.25 volt power supply voltages denominated as $V_{tt}$ or $V_{dd}$. It is also possible to set $V_{tt}$ equal to zero during normal operation to avoid unnecessary power consumption.

Thus there has been described a linear feedback shift register, LFSR, capable of performing multiple test functions on a VSLI circuit. These functions are carried out by connections between cells of the LFSR, and by the application of certain clock signals. The LFSR provides for an improved test capability over standard LSSD techniques, with only minimal addition of hardware and pin out requirements for the VLSI circuit. Those skilled in the art will recognize yet other embodiments of the invention to be described more particularly by the claim which follow.

What is claimed is:

1. A programmable linear feedback shift register for self-testing a VLSI circuit, said register having a plurality of two bit stages, each stage comprising:
    a first exclusive NOR circuit for receiving a binary shift signal from a preceding stage, and a feedback signal;
    a second exclusive NOR circuit for receiving a first logical signal from said first exclusive NOR circuit, and an input signal;
    a cross-coupled register connected to receive a signal from said VLSI circuit during normal VLSI circuit operation, and a signal from said second exclusive NOR circuit during a test operation;
    an inverter circuit for receiving an output signal from said cross-coupled register, said inverter circuit supplying a shift signal for application to a subsequent stage first exclusive NOR circuit; and
    means for coupling said second exclusive NOR circuit output during a first test interval to said cross-coupled register, and an output signal from said cross-coupled register to said inverter during a second test interval.

2. The programmable linear feedback shift register of claim 1 wherein said first exclusive NOR circuit comprises:
    a pair of cross-coupled FETs having one input connected to receive a shift signal, and a remaining input; and
    a feedback gate for applying a binary feedback signal to said remaining input and applying a logical zero binary state signal to said remaining input in the absence of a feedback pulse.

3. The programmable linear feedback shift register of claim 2 wherein said second exclusive NOR circuit is coupled through a gate circuit means to receive an input signal in response to an enabling INPUT signal.

4. The programmable linear feedback shift register of claim 1 wherein said cross-coupled register comprises:
    first and second series transistor pairs each transistor of each pair being of an opposite conductivity type, one of said transistors of a pair having a gate connected to the series connection point of the remaining pair of transistors; and
    a transistor coupling the series connection point of said remaining pair to the gate of a transistor of said one pair.

5. In a VLSI circuit, a register for performing testing functions for a remaining portion of said VLSI circuit comprising:
    a multicell register, each of said cells comprising:
    a one bit register;
    a first exclusive NOR gate;
    a second exclusive NOR gate;
    said first exclusive NOR gate having a first input connected to receive the output signal from said second exclusive NOR gate, and a second input adapted to receive a logical INPUT signal;

said second exclusive NOR gate having first and second inputs adapted to receive a SHIFT IN signal and FEEDBACK signal; and means for connecting the output of said first exclusive NOR gate to said one bit register input and the output of said one bit register to an input of the second exclusive NOR gate of another of said cells during respective first and second test intervals.

6. The register of claim 5 further comprising a gate circuit connected to control a signal entering said first exclusive NOR gate second input.

* * * * *

UNITED STATES PATENT AND TRADEMARK OFFICE
CERTIFICATE OF CORRECTION

PATENT NO. : 4,680,539
DATED : July 14, 1987
INVENTOR(S) : Mon Yen Tsai

It is certified that error appears in the above-identified patent and that said Letters Patent is hereby corrected as shown below:

In column 1, line 15, "Vol. SC-15, No, June 3" should read --Vol. SC-15, No. 3, June --.

In column 2, line 13, change "frm" to --from--.

In column 3, line 8, in both instances, change "LSFR" to --LFSR--.

In column 5, line 27, after "signal" (first occurrence) delete ",the" in favor of --. The--.

Signed and Sealed this

Seventeenth Day of May, 1988

*Attest:*

DONALD J. QUIGG

*Attesting Officer*      *Commissioner of Patents and Trademarks*